United States Patent
Ha et al.

(10) Patent No.: US 10,830,807 B2
(45) Date of Patent: Nov. 10, 2020

(54) METHOD OF LOCATING A FAULT IN A POWER TRANSMISSION SCHEME

(71) Applicant: General Electric Technology GmbH, Baden (CH)

(72) Inventors: Hengxu Ha, Stafford (GB); Sankara Subramanian, Stafford (GB)

(73) Assignee: General Electric Technology GmbH, Baden (CH)

(*) Notice: Subject to any disclaimer, the term of this patent is extended or adjusted under 35 U.S.C. 154(b) by 163 days.

(21) Appl. No.: 16/074,797

(22) PCT Filed: Feb. 2, 2017

(86) PCT No.: PCT/EP2017/052205
§ 371 (c)(1),
(2) Date: Aug. 2, 2018

(87) PCT Pub. No.: WO2017/134136
PCT Pub. Date: Aug. 10, 2017

(65) Prior Publication Data
US 2019/0041448 A1 Feb. 7, 2019

(30) Foreign Application Priority Data
Feb. 2, 2016 (EP) ..................................... 16275017

(51) Int. Cl.
*G01R 31/08* (2020.01)
*H02H 7/26* (2006.01)

(52) U.S. Cl.
CPC ......... *G01R 31/086* (2013.01); *G01R 31/088* (2013.01); *H02H 7/263* (2013.01); *Y04S 10/52* (2013.01)

(58) Field of Classification Search
CPC .... G01R 31/08; G01R 31/081; G01R 31/086; G01R 31/088; G01R 19/16571;
(Continued)

(56) References Cited

U.S. PATENT DOCUMENTS

2009/0150099 A1* 6/2009 Balcerek .............. G01R 31/086
702/59
2010/0014198 A1* 1/2010 Dusang, Jr. ............ H02H 3/165
361/47
(Continued)

OTHER PUBLICATIONS

European Search Report and Written Opinion dated Aug. 17, 2016 which was issued in connection with EP 16275017.8 which was filed on Feb. 2, 2016.
(Continued)

*Primary Examiner* — Son T Le
(74) *Attorney, Agent, or Firm* — Eversheds Suthrland (US) LLP (57) ABSTRACT

There is provided a method of locating a fault in a power transmission scheme. The power transmission scheme includes power transmission sections and a first end connection point, a second end connection point, and at least one intermediate connection point. The method includes
(i) measuring first and second end voltage phasors at the first and second end connection points respectively;
(ii) obtaining a first set of voltage phasors, which includes the measured first end voltage phasor and includes respective voltage phasors at each of the second and intermediate connection points;
(iii) obtaining a second set of voltage phasors, which includes the measured second end voltage phasor and includes respective voltage phasors at each of the first and intermediate connection points;
(iv) comparing the first and second sets of voltage phasors to identify the power transmission section or connection point corresponding to the location of the fault.

14 Claims, 4 Drawing Sheets

(58) Field of Classification Search
CPC ....... G01R 29/085; Y04S 10/522; H02H 7/26; H02H 7/263
See application file for complete search history.

(56) References Cited

U.S. PATENT DOCUMENTS

| | | | |
|---|---|---|---|
| 2014/0229127 A1* | 8/2014 | Ren | H02H 3/40 |
| | | | 702/59 |
| 2015/0226780 A1* | 8/2015 | Sun | G01R 31/088 |
| | | | 702/59 |

OTHER PUBLICATIONS

International Search Report and Written Opinion dated Apr. 6, 2017 which was issued in connection with PCT PCT/EP2017/052205 which was filed on Feb. 2, 2017.
Office Action, CN 201780009737.1, dated Jan. 2, 2020 (in Chinese) (15 pp.).
Office Action, CN 201780009737.1, dated Jan. 2, 2020 (in English) (11 pp.).
Filed EP Response, 16275017.8, dated Feb. 8, 2018, with EP Claim Amendments in Response (10 pp.).

* cited by examiner

METHOD OF LOCATING A FAULT IN A POWER TRANSMISSION SCHEME

FIELD OF INVENTION

This invention relates to a method of locating a fault in a power transmission scheme, an apparatus for locating a fault in a power transmission scheme, and a power transmission scheme comprising such an apparatus.

BRIEF DESCRIPTION OF THE INVENTION

According to a first aspect of the invention, there is provided a method of locating a fault in a power transmission scheme, the power transmission scheme including a plurality of power transmission sections and a plurality of connection points, the plurality of connection points including a first end connection point, a second end connection point and at least one intermediate connection point connected between the first and second end connection points, each of the plurality of power transmission sections arranged to interconnect a respective two of the plurality of connection points such that the plurality of power transmission sections are connected successively between the first and second end connection points and such that the or each intermediate connection point interconnects a or a respective neighbouring pair of the power transmission sections, the method comprising the steps of:

measuring first and second end voltage phasors at the first and second end connection points respectively;

obtaining a first set of voltage phasors, wherein the first set of voltage phasors includes the measured first end voltage phasor and further includes respective voltage phasors at each of the second and intermediate connection points that are determined based on the measured first end voltage phasor;

obtaining a second set of voltage phasors, wherein the second set of voltage phasors includes the measured second end voltage phasor and further includes respective voltage phasors at each of the first and intermediate connection points that are determined based on the measured second end voltage phasor;

comparing the first and second sets of voltage phasors to identify the power transmission section or connection point corresponding to the location of the fault, wherein each voltage phasor of the first set of voltage phasors is compared to the respective voltage phasor of the second set of voltage phasors that corresponds to the same connection point.

The method of the invention not only results in efficient determination of the location of a fault in a power transmission scheme, but also is accurate due to the consideration of the distributed parameters of the power transmission scheme. In addition the method of the invention is readily scalable to accommodate different topologies of the power transmission scheme. The latter is particularly for use in a power transmission scheme with a complex layout, such as a multi-ended power transmission scheme.

The method of the invention therefore permits quick determination of the location of a fault in a power transmission scheme, which reduces the time required to locate and repair the fault and thereby minimises the downtime of the power transmission scheme.

The first and second sets of voltage phasors may be determined in various ways. For example, in embodiments of the invention, the method may further include the steps of: measuring first and second end current phasors at the first and second end connection points respectively;

obtaining the first set of voltage phasors, wherein the first set of voltage phasors includes the measured first end voltage phasor and further includes respective voltage phasors at each of the second and intermediate connection points that are determined based on the measured first end voltage and current phasors;

obtaining the second set of voltage phasors, wherein the second set of voltage phasors includes the measured second end voltage phasor and further includes respective voltage phasors at each of the first and intermediate connection points that are determined based on the measured second end voltage and current phasors.

In further embodiments of the invention, the power transmission section connected to the first connection point may be designated as a first power transmission section, the power transmission section connected to the second connection point may be designated as a second power transmission section, the or each other power transmission section connected between the or the respective neighbouring pair of intermediate connection points may be designated as an intermediate power transmission section. In such embodiments the method may further include the steps of:

measuring first and second end current phasors at the first and second end connection points respectively;

obtaining a first set of current phasors, wherein the first set of current phasors includes respective current phasors in the first, second and intermediate power transmission sections that are determined based on the measured first end voltage and current phasors;

obtaining a second set of current phasors, wherein the second set of current phasors includes respective current phasors in the first, second and intermediate power transmission sections that are determined based on the measured second end voltage and current phasors.

The first and second sets of current phasors may be used in the method of the invention to help identify the location of the fault, e.g. by calculating fault distance.

For example, the respective voltage phasors at the second and intermediate connection points of the first set of voltage phasors may be determined based on the measured first end voltage phasor and the first set of current phasors, and the respective voltage phasors at the first and intermediate connection points of the second set of voltage phasors may be determined based on the measured second end voltage phasor and the second set of current phasors.

As discussed above, the power transmission scheme may be a multi-ended power transmission scheme. For example, the power transmission scheme may further include a further power transmission section connecting the intermediate connection point to a further connection point or a plurality of further power transmission sections each connecting a respective one of the intermediate connection points to a respective one of a plurality of further connection points. For such a power transmission scheme, the method may further include the steps of:

measuring a or a respective voltage phasor at the or each further connection point;

measuring a or a respective current phasor at the or each further connection point;

determining a or a respective further current phasor flowing into the corresponding intermediate connection point and in the or each further power transmission section based on the measured voltage and current phasors of the corresponding further connection point.

The or each further current phasor may be used in the method of the invention to help identify the location of the fault, e.g. by calculating the voltage and current phasors of a neighbouring connection point.

For example, the respective current phasors in the first, second and intermediate power transmission sections of the first set of current phasors may be determined based on the measured first end voltage and current phasors and the or each further current phasor, and the respective current phasors in the first, second and intermediate power transmission sections of the second set of current phasors may be determined based on the measured second end voltage and current phasors and the or each further current phasor.

Furthermore, with respect to the aforementioned multi-ended power transmission scheme, the method may further include the steps of:

measuring a or a respective voltage phasor at the or each further connection point;

measuring a or a respective current phasor at the or each further connection point;

determining a or a respective further voltage phasor at the or each intermediate connection point based on the measured voltage and current phasors of the corresponding further connection point.

The or each further voltage phasor may be used in the method of the invention to help identify the location of the fault, as detailed later.

The steps of the method of the invention may include further sub-steps in order to better pinpoint the location of the fault in the power transmission scheme. In an exemplary embodiment the step of comparing the first and second sets of voltage phasors may include:

obtaining a subtraction voltage phasor of each connection point, wherein the subtraction voltage phasor of each connection point is equal to the difference between the corresponding voltage phasors of the first and second sets of voltage phasors;

determining the minimum amplitude value of the plurality of subtraction voltage phasors;

comparing the minimum amplitude value with a predefined criterion threshold to identify the power transmission section or connection point corresponding to the location of the fault.

In embodiments of the invention based on the use of the minimum amplitude value, the step of comparing the first and second sets of voltage phasors may include:

if the minimum amplitude value is less than the predefined criterion threshold, comparing the voltage phasor and further voltage phasor of the intermediate connection point to determine whether the location of the fault is on the intermediate connection point or in the further power transmission section corresponding to the minimum amplitude value.

In further embodiments of the invention based on the use of the minimum amplitude value, the step of comparing the first and second sets of voltage phasors further includes:

if the minimum amplitude value is more than the predefined criterion threshold, comparing the voltage phasors of the connection point corresponding to the minimum amplitude value with the voltage phasors of a neighbouring connection point to identify the power transmission section corresponding to the location of the fault.

In such embodiments, the step of comparing the first and second sets of voltage phasors further includes:

if the minimum amplitude value is more than the predefined criterion threshold, comparing the phase or amplitude of the subtraction voltage phasor of the connection point corresponding to the minimum amplitude value with the phase or amplitude of the subtraction voltage phasor of a neighbouring connection point to identify the power transmission section corresponding to the location of the fault.

If a given power transmission section is identified as the location of the fault, the method may further include the step of using the corresponding voltages and currents to form a two-ended system equivalent of the power transmission section identified as the location of the fault. In such embodiments the method may further include the step of determining the distance of the fault along the power transmission section on the basis of the voltage and currents of the two-ended system equivalent.

According to a second aspect of the invention, there is provided an apparatus for locating a fault in a power transmission scheme, the power transmission scheme including a plurality of power transmission sections and a plurality of connection points, the plurality of connection points including a first end connection point, a second end connection point and at least one intermediate connection point connected between the first and second end connection points, each of the plurality of power transmission sections arranged to interconnect a respective two of the plurality of connection points such that the plurality of power transmission sections are connected successively between the first and second end connection points and such that the or each intermediate connection point interconnects a or a respective neighbouring pair of the power transmission sections, the apparatus configured to:

measure first and second end voltage phasors at the first and second end connection points respectively;

obtain a first set of voltage phasors, wherein the first set of voltage phasors includes the measured first end voltage phasor and further includes respective voltage phasors at each of the second and intermediate connection points that are determined based on the measured first end voltage phasor;

obtain a second set of voltage phasors, wherein the second set of voltage phasors includes the measured second end voltage phasor and further includes respective voltage phasors at each of the first and intermediate connection points that are determined based on the measured second end voltage phasor;

compare the first and second sets of voltage phasors to identify the power transmission section or connection point corresponding to the location of the fault, wherein each voltage phasor of the first set of voltage phasors is compared to the respective voltage phasor of the second set of voltage phasors that corresponds to the same connection point.

According to a third aspect of the invention, there is provided a power transmission scheme including a plurality of power transmission sections and a plurality of connection points, the plurality of connection points including a first end connection point, a second end connection point and at least one intermediate connection point connected between the first and second end connection points, each of the plurality of power transmission sections arranged to interconnect a respective two of the plurality of connection points such that the plurality of power transmission sections are connected successively between the first and second end connection points and such that the or each intermediate connection point interconnects a or a respective neighbouring pair of the power transmission sections, wherein the power transmission scheme further includes the apparatus of the second aspect of the invention.

The features of the method of the first aspect of the invention and its embodiments apply mutatis mutandis to the apparatus of the second aspect of the invention and the power transmission scheme of the third aspect of the invention and its embodiments. Accordingly optional features of the method of the first aspect of the invention may be applied correspondingly to the apparatus of the second aspect of the invention and the power transmission scheme of the third aspect of the invention and its embodiments.

It will also be appreciated that the use of the terms "first" and "second" in the patent specification is merely intended to help distinguish between similar features (e.g. the first and second sets of voltage phasors), and is not intended to indicate the relative importance of one feature over another feature.

BRIEF DESCRIPTION OF THE DRAWINGS

In an embodiment of the invention will now be described, with reference to a non-limiting example, with reference to the accompanying drawings in which.

DETAILED DESCRIPTION OF THE INVENTION

A fault may occur during the operation of a power transmission scheme, thus potentially resulting in downtime in order to ensure the safety of the power transmission scheme and its users. Such downtime however prevents electricity from being supplied via the power transmission scheme. This not only inconveniences end consumers reliant on the electricity transmitted via the power transmission scheme but also results in economic damages to the operator of the power transmission scheme.

Restoration of the power transmission scheme to working order requires the repair of the fault, which requires the rapid determination of the location of the fault in the power transmission scheme in order to minimise the length of the downtime.

Figure 1:
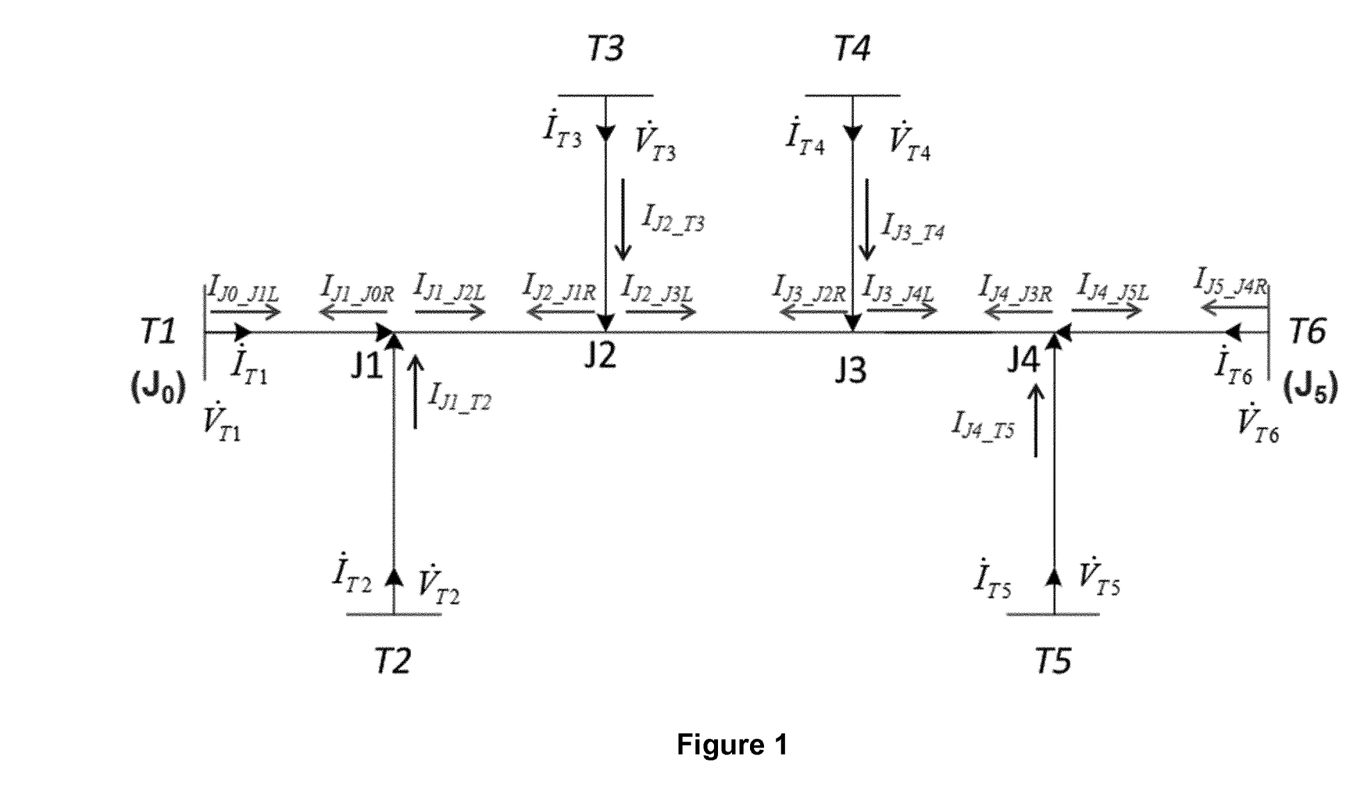
FIG. 1 shows a schematic representation of the topology of a power transmission scheme according to an embodiment of the invention.

A power transmission scheme according to an embodiment of the invention is shown in FIG. 1.

The power transmission scheme comprises a plurality of power transmission sections and a plurality of connection points.

Each connection point is in the form of a junction. The plurality of junctions includes a first end junction, a second end junction and a plurality of intermediate junctions connected between the first and second end junctions. In FIG. 1 the first end junction is indicated as $J_0$, the second end junction is indicated as $J_5$, and the intermediate junctions are respectively indicated as $J_1$, $J_2$, $J_3$ and $J_4$.

A first of the power transmission sections is connected between junctions $J_0$ and $J_1$. A second of the power transmission sections is connected between junctions $J_4$ and $J_5$. The three remaining power transmission sections are intermediate power transmission sections connected between junctions $J_1$ and $J_2$, between junctions $J_2$ and $J_3$ and between junctions $J_3$ and $J_4$ respectively. In this manner each of the plurality of power transmission sections is arranged to interconnect a respective two of the plurality of junctions $J_0$, $J_1$, $J_2$, $J_3$, $J_4$, $J_5$ such that the plurality of power transmission sections are connected successively between the first and second end junctions $J_0$, $J_5$ and such that each intermediate junction $J_1$, $J_2$, $J_3$, $J_4$ interconnects a respective neighbouring pair of the power transmission sections.

The junction $J_0$ is directly connected to a first terminal T1. The junction $J_5$ is directly connected to a second terminal T6.

The power transmission scheme further includes a plurality of further power transmission sections. The junction $J_1$ is connected to a third terminal T2 via a first, further power transmission section, the junction $J_2$ is connected to a third terminal T3 via a second, further power transmission section, the junction $J_3$ is connected to a third terminal T4 via a third, further power transmission section, and the junction $J_4$ is connected to a third terminal T5 via a fourth, further power transmission section.

Figure 2:
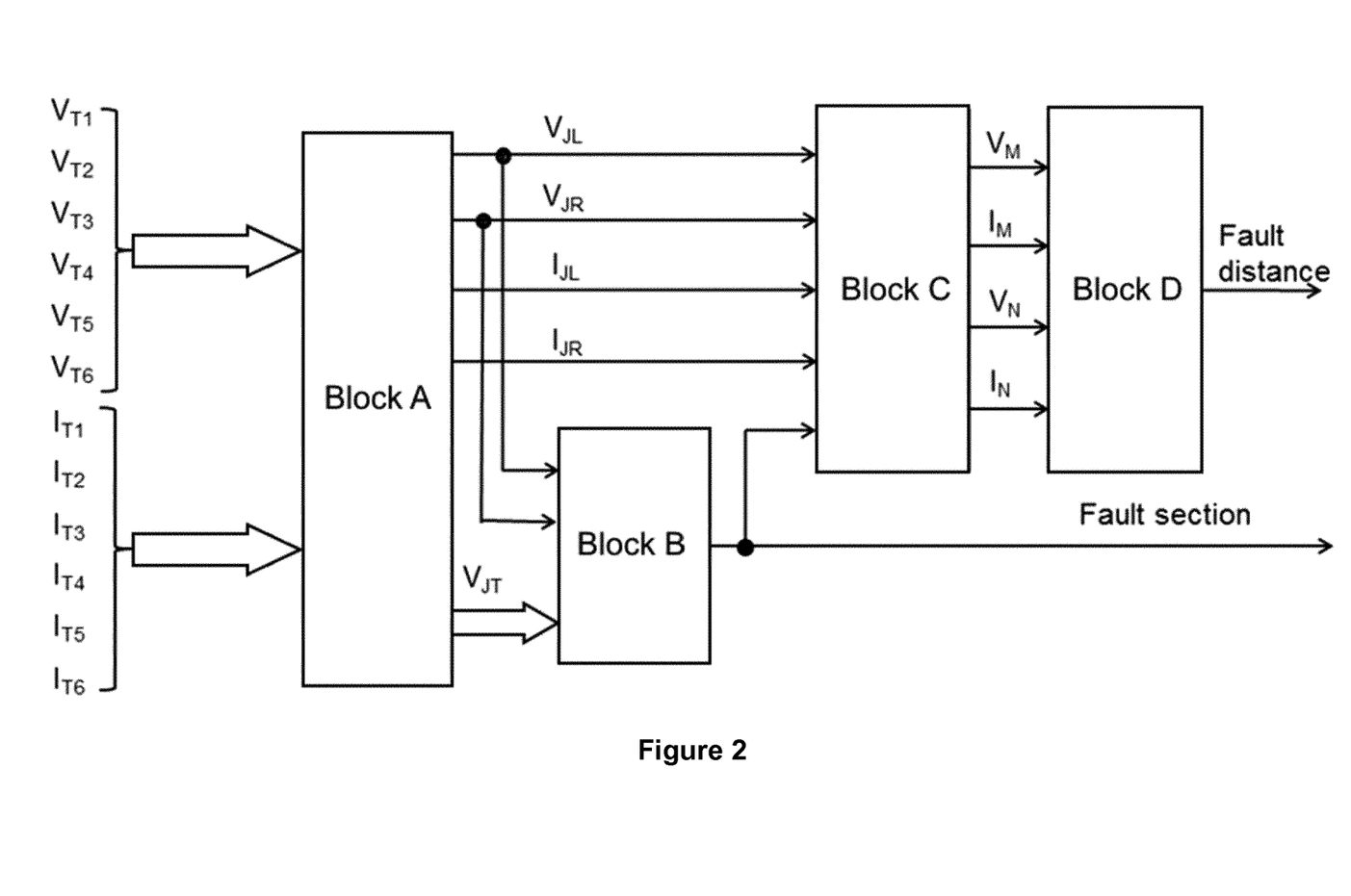
FIG. 2 shows a schematic representation of an apparatus forming a part of the power transmission scheme of FIG. 1.

The power transmission scheme further includes an apparatus that comprises a plurality of blocks A, B, C and D, as shown in FIG. 2.

A method of locating a fault in the power transmission scheme of FIG. 1 will now be described as follows, with reference to FIGS. 1 to 4.

Figure 3:
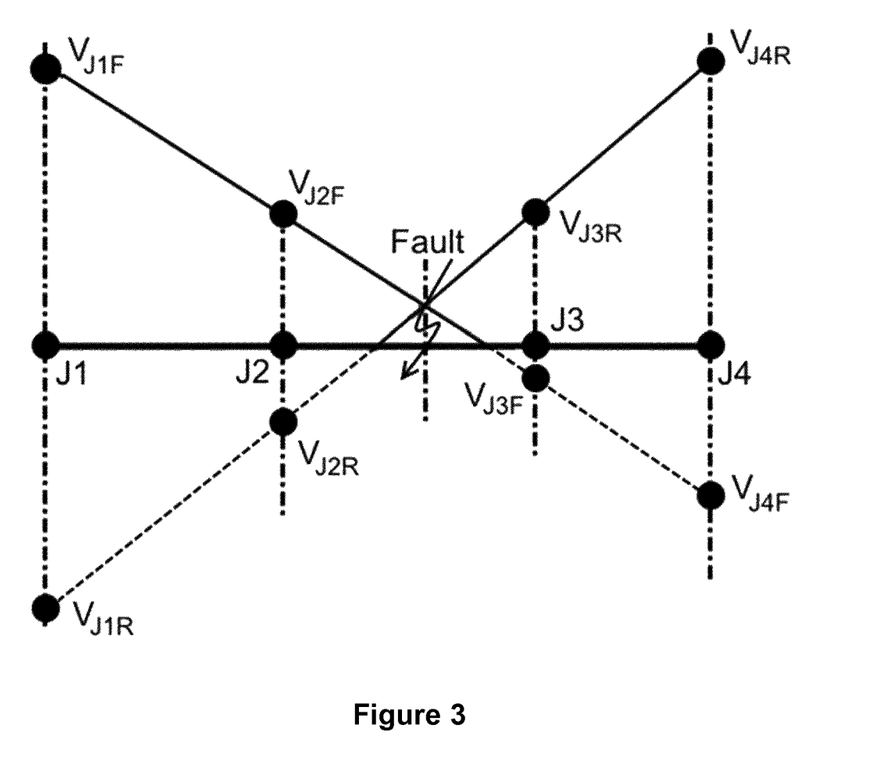
FIG. 3 illustrates a voltage profile along the power transmission scheme of FIG. 1 during the occurrence of a fault.

In general the method of the invention is based on the measurement of the voltage phasors at the junctions $J_0$ and $J_5$, the calculation of the voltage phasors in the rest of the power transmission scheme based on the measured voltage phasors, and the comparison of the voltage phasors. For example, if the fault is located between junctions $J_2$ and $J_3$, the voltage at the point of fault calculated based on the voltage phasor at the junction $J_0$ is the same as the voltage at the point of fault calculated based on the voltage phasor at the junction $J_5$. FIG. 3 illustrates the voltage profile along the power transmission scheme of FIG. 1 during the occurrence of a fault.

More particularly the method of the invention includes the following steps.

Initially voltage phasors $V_{T1}$, $V_{T2}$, $V_{T3}$, $V_{T4}$, $V_{T5}$, $V_{T6}$ are measured at the terminals T1, T2, T3, T4, T5, T6 respectively, and current phasors $I_{T1}$, $I_{T2}$, $I_{T3}$, $I_{T4}$, $I_{T5}$, $I_{T6}$ are measured at the terminals T1, T2, T3, T4, T5, T6 respectively.

The measured voltage and current phasors are then fed into Block A of the apparatus to calculate: first and second sets of voltage phasors at the junctions; first and second sets of current phasors in the power transmission sections interconnecting the junctions; and further voltage phasors at the junctions.

The following steps are based on $J_0$ as a starting point and $J_5$ as an end point. It is envisaged that, in other embodiments of the invention, the following steps are based on $J_5$ as a starting point and $J_0$ as an end point. It is also envisaged that, in still other embodiments of the invention, T2 may be used in place of $J_0$ as a starting point and/or T5 may be used in place of $J_5$ as an end point.

The selection of the starting and end points can be indicated by a topology matrix representing the topology of the power transmission scheme, which is settable and inputted by a user. The topology matrix is defined as follows:

$$TopMatrix = \begin{bmatrix} & J_1 & J_2 & J_3 & J_4 \\ T_1 & 1 & 0 & 0 & 0 \\ T_2 & 1 & 0 & 0 & 0 \\ T_3 & 0 & 1 & 0 & 0 \\ T_4 & 0 & 0 & 1 & 0 \\ T_5 & 0 & 0 & 0 & 1 \\ T_6 & 0 & 0 & 0 & 1 \end{bmatrix}$$

The number of rows in the topology matrix equals the number of terminals so that each row of the topology matrix represents each terminal, and the number of columns in the topology matrix equals the number of junctions so that each column of the topology matrix represents each junction. Thus, if the mth terminal is connected with nth junction, then the mth row, nth column of the matrix is set as 1; if the mth terminal is not connected with nth junction, then the mth row, nth column of the matrix is set as 0.

Moving from $J_0$ to $J_5$ (left to right in FIG. 1), the first sets of voltage and current phasors are determined.

In the first set of voltage phasors $V_{JL}$, the voltage phasor at junction $J_0$ is $V_{J0L}$, the voltage phasor at junction $J_1$ is $V_{J1L}$, the voltage phasor at junction $J_2$ is $V_{J2L}$, the voltage phasor at junction $J_3$ is $V_{J3L}$, the voltage phasor at junction $J_4$ is $V_{J4L}$, and the voltage phasor at junction $J_5$ is $V_{J5L}$.

In the first set of current phasors $I_{JL}$, the current in the power transmission section between junctions $J_0$ and $J_1$ is $I_{J0\_J1L}$, the current in the power transmission section between junctions $J_1$ and $J_2$ is $I_{J1\_J2L}$, the current in the power transmission section between junctions $J_2$ and $J_3$ is $I_{J2\_J3L}$, the current in the power transmission section between junctions $J_3$ and $J_4$ is $I_{J3\_J4L}$, and the current in the power transmission section between junctions $J_4$ and $J_5$ is $I_{J4\_J5L}$.

The voltage phasor $V_{J0L}$ at junction $J_0$ is equal to the measured voltage phasor $V_{T1}$ at terminal T1, and the current $I_{J0\_J1L}$ in the power transmission section between junctions $J_0$ and $J_1$ is equal to the current phasor $I_{T1}$ measured at the terminal T1.

$$V_{J0L} = V_{T1}\ I_{J0\_J1L} = I_{T1}$$

Each of the other voltage phasors $V_{J1L}$, $V_{J2L}$, $V_{J3L}$, $V_{J4L}$, $V_{J5L}$ at the respective junction $J_1$, $J_2$, $J_3$, $J_4$, $J_5$ is calculated based on the voltage phasor of the preceding junction and the current phasor of the preceding power transmission section. Each of the other current phasors $I_{J1\_J2L}$, $I_{J2\_J3L}$, $I_{J3\_J4L}$, $I_{J4\_J5L}$ in the respective power transmission sections are based on the voltage phasor of the preceding junction, the current phasor of the preceding power transmission section, and the current phasor in the further power transmission medium connected to the preceding junction.

$$V_{JkL} = A_{Jk-1Jk} V_{Jk-1L} + B_{Jk-1Jk} I_{Jk-1\_JkL};$$

$$I_{Jk\_Jk+1L} = C_{Jk-1Jk} V_{Jk-1L} + D_{Jk-1Jk} I_{Jk-1\_JkL} + \sum_{n \in J_k} I_{Jk\_Tn};$$

where $k$ ranges from 1 to 5;

$$A_{Jk-1Jk} = D_{Jk-1Jk} = \cosh(\gamma_{Jk-1Jk} l_{Jk-1Jk});$$

$$B_{Jk-1Jk} = -Z_{CJk-1Jk} \sinh(\gamma_{Jk-1Jk} l_{Jk-1Jk});$$

$$C_{Jk-1Jk} = -\sinh(\gamma_{Jk-1Jk} l_{Jk-1Jk})/Z_{CJk-1Jk};$$

$$\gamma_{Jk-1Jk} = \sqrt{z_{Jk-1Jk} y_{Jk-1Jk}};$$

-continued $$Z_{CJk-1Jk} = \sqrt{z_{Jk-1Jk}/y_{Jk-1Jk}};$$

$z_{Jk-1Jk}$ is the impedance per length of the power transmission section interconnecting the k−1th junction to the kth junction;

$y_{Jk-1Jk}$ is the admittance per length of the power transmission section interconnecting the k−1th junction to the kth junction;

$l_{Jk-1Jk}$ is the line length of the power transmission section interconnecting the k−1th junction to kth the junction;

$I_{Jk\_Tn}$ is the nth-terminal-to-kth-junction current flowing in the further power transmission medium connected to the kth junction.

Moving from $J_5$ to $J_1$ (right to left in FIG. 1), the second sets of voltage and current phasors are determined.

In the second set of voltage phasors $V_{JR}$, the voltage phasor at junction $J_0$ is $V_{J0R}$, the voltage phasor at junction $J_1$ is $V_{J1R}$, the voltage phasor at junction $J_2$ is $V_{J2R}$, the voltage phasor at junction $J_3$ is $V_{J3R}$, the voltage phasor at junction $J_4$ is $V_{J4R}$, and the voltage phasor at junction $J_5$ is $V_{J5R}$.

In the second set of current phasors $I_{JR}$, the current in the power transmission section between junctions $J_5$ and $J_4$ is $I_{J5\_J4R}$, the current in the power transmission section between junctions $J_4$ and $J_3$ is $I_{J4\_J3R}$, the current in the power transmission section between junctions $J_3$ and $J_2$ is $I_{J3\_J2R}$, the current in the power transmission section between junctions $J_2$ and $J_1$ is $I_{J2\_J1R}$, and the current in the power transmission section between junctions $J_1$ and $J_0$ is $I_{J1\_J0R}$.

The voltage phasor $V_{J5R}$ at junction $J_6$ is equal to the measured voltage phasor $V_{T5}$ at terminal T5, and the current $I_{J4\_J5L}$ in the power transmission section between junctions $J_4$ and $J_5$ is equal to the current phasor $I_{T6}$ measured at the terminal T6.

$$V_{J5R} = V_{T5}\ I_{J5\_J4R} = I_{T6}$$

Each of the other voltage phasors $V_{J1R}$, $V_{J2R}$, $V_{J3R}$, $V_{J4R}$ at the respective junction $J_1$, $J_2$, $J_3$, $J_4$, $J_5$ is calculated based on the voltage phasor of the preceding junction and the current phasor of the preceding power transmission section. Each of the other current phasors $I_{J1\_J0R}$, $I_{J2\_J1R}$, $I_{J3\_J2R}$, $I_{J4\_J3R}$ in the respective power transmission sections are based on the voltage phasor of the preceding junction, the current phasor of the preceding power transmission section, and the current phasor in the further power transmission medium connected to the preceding junction.

$$V_{JkR} = A_{Jk+1Jk} V_{Jk+1R} + B_{Jk+1Jk} I_{Jk+1\_JkR};$$

$$I_{Jk\_Jk-1L} = C_{Jk+1Jk} V_{Jk+1R} + D_{Jk+1Jk} I_{Jk+1\_JkR} + \sum_{n \in J_k} I_{Jk\_Tn};$$

where;

$$A_{Jk+1Jk} = D_{Jk+1Jk} = \cosh(\gamma_{Jk+1Jk} l_{Jk+1Jk});$$

$$B_{Jk+1Jk} = -Z_{CJk-1Jk} \sinh(\gamma_{Jk+1Jk} l_{Jk+1Jk});$$

$$C_{Jk+1Jk} = -\sinh(\gamma_{Jk+1Jk} l_{Jk+1Jk})/Z_{CJk+1Jk};$$

$$\gamma_{Jk+1Jk} = \sqrt{z_{Jk+1Jk} y_{Jk+1Jk}};$$

$$Z_{CJk+1Jk} = \sqrt{z_{Jk+1Jk}/y_{Jk+1Jk}};$$

$z_{Jk+1,Jk}$ is the impedance per length of the power transmission section interconnecting the k+1th junction to kth junction;

$y_{Jk+1,Jk}$ is the admittance per length of the power transmission section interconnecting the k+1th junction to the kth junction;

$l_{Jk+1,Jk}$ is the line length of the power transmission section interconnecting the k+1th junction to the kth junction;

$I_{Jk\_Tn}$ is the nth-terminal-to-kth-junction current flowing in the further power transmission medium connected to the kth junction.

In the further voltage phasors $V_{JT}$, the further voltage phasor at junction $J_1$ is $V_{J1\_T2}$, the further voltage phasor at junction $J_2$ is $V_{J2\_T3}$, the further voltage phasor at junction $J_3$ is $V_{J3\_T4}$, and the further voltage phasor at junction $J_4$ is $V_{J4\_T5}$.

Further current phasors in the respective further power transmissions sections are also calculated. In the further current phasors $I_{JT}$, the current in the further power transmission section between junction $J_1$ and terminal T2 is $I_{J1\_T2}$, the current in the further power transmission section between junction $J_2$ and terminal T3 is $I_{J2\_T3}$, the current in the further power transmission section between junction $J_3$ and terminal T4 is $I_{J3\_T4}$, and the current in the further power transmission section between junction $J_4$ and terminal T5 is $I_{J4\_T5}$.

The further voltage and current phasors for junction $J_1$ with respect to terminal T2 are calculated by the following equations:

$$\begin{cases} V_{J1\_T2} = A_2 V_{T2} + B_2 I_{T2} \\ I_{J1\_T2} = C_2 V_{T2} + D_2 I_{T2} \end{cases}$$

where $A_2 = D_2 = \cosh(\gamma_2 l_{T2})$;

$B_2 = -Z_{C2}\sinh(\gamma_2 l_{T2})$;

$C_2 = -\sinh(\gamma_2 l_{T2})/Z_{C2}$;

$\gamma_2 = \sqrt{z_2 y_2}$;

$Z_{C2} = \sqrt{z_2/y_2}$;

$z_2$ is the impedance per length of the further power transmission section interconnecting junction $J_1$ to terminal T2;

$y_2$ is the admittance per length of the further power transmission section interconnecting junction $J_1$ to terminal T2;

$l_{T2}$ is the line length of the further power transmission section interconnecting junction $J_1$ to terminal T2.

The further voltage and current phasors for junction $J_2$ with respect to terminal T3 are calculated by the following equations:

$$\begin{cases} V_{J2\_T3} = A_3 V_{T3} + B_3 I_{T3} \\ I_{J2\_T3} = C_3 V_{T3} + D_3 I_{T3} \end{cases}$$

where $A_3 = D_3 = \cosh(\gamma_3 l_{T3})$;

$B_3 = -Z_{C3}\sinh(\gamma_3 l_{T3})$;

$C_3 = -\sinh(\gamma_3 l_{T3})/Z_{C3}$;

$\gamma_3 = \sqrt{z_3 y_3}$;

$Z_{C3} = \sqrt{z_3/y_3}$;

$z_3$ is the impedance per length of the further power transmission section interconnecting junction $J_2$ to terminal T3;

$y_3$ is the admittance per length of the further power transmission section interconnecting junction $J_2$ to terminal T3;

$l_{T3}$ is the line length of the further power transmission section interconnecting junction $J_2$ to terminal T3.

The further voltage and current phasors for junction $J_3$ with respect to terminal T4 are calculated by the following equations:

$$\begin{cases} V_{J3\_T4} = A_4 V_{T4} + B_4 I_{T4} \\ I_{J3\_T4} = C_4 V_{T4} + D_4 I_{T4} \end{cases}$$

where $A_4 = D_4 = \cosh(\gamma_4 l_{T4})$;

$B_4 = -Z_{C4}\sinh(\gamma_4 l_{T4})$;

$C_4 = -\sinh(\gamma_4 l_{T4})/Z_{C4}$;

$\gamma_4 = \sqrt{z_4 y_4}$;

$Z_{C4} = \sqrt{z_4/y_4}$;

$z_4$ is the impedance per length of the further power transmission section interconnecting junction $J_3$ to terminal T4;

$y_4$ is the admittance per length of the further power transmission section interconnecting junction $J_3$ to terminal T4;

$l_{T4}$ is the line length of the further power transmission section interconnecting junction $J_3$ to terminal T4.

The further voltage and current phasors for junction $J_4$ with respect to terminal T5 are calculated by the following equations:

$$\begin{cases} V_{J4\_T5} = A_5 V_{T5} + B_5 I_{T5} \\ I_{J4\_T5} = C_5 V_{T5} + D_5 I_{T5} \end{cases}$$

where $A_5 = D_5 = \cosh(\gamma_5 l_{T5})$;

$B_5 = -Z_{C5}\sinh(\gamma_5 l_{T5})$;

$C_5 = -\sinh(\gamma_5 l_{T5})/Z_{C5}$;

$\gamma_5 = \sqrt{z_5 y_5}$;

$Z_{C5} = \sqrt{z_5/y_5}$;

$z_5$ is the impedance per length of the further power transmission section interconnecting junction $J_4$ to terminal T5;

$y_5$ is the admittance of the further power transmission section interconnecting junction $J_4$ to terminal T5;

$l_{T5}$ is the line length of the further power transmission section interconnecting junction $J_4$ to terminal T5).

The first and second sets of voltage phasors $V_{JL}$, $V_{VR}$ and the further voltage phasors $V_{JT}$ are then fed into Block B to compare the voltage phasors to identify the power transmission section or junction corresponding to the location of the fault, as follows. The following steps are illustrated in the flow diagram of FIG. 4.

Figure 4:
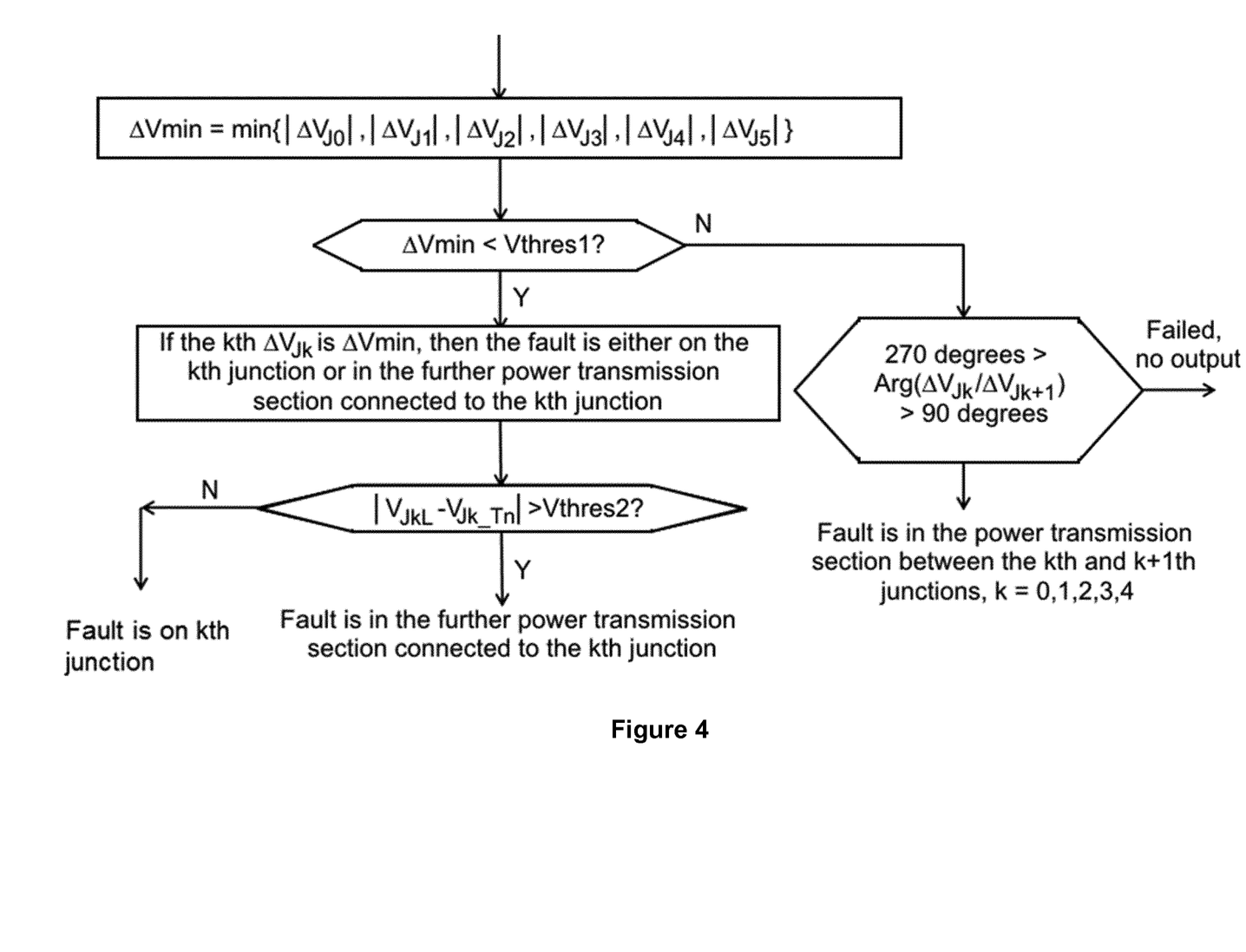
FIG. 4 shows a flow diagram which illustrates steps in a method of locating a fault in the power transmission scheme of FIG. 1.

A subtraction voltage phasor for each junction is obtained. In this regard the subtraction voltage phasor of each junction is equal to the difference between the corresponding voltage phasors of the first and second sets of voltage phasors $V_{JL}$, $V_{JR}$, as shown in the following equation.

$$\Delta V_J = \begin{bmatrix} \Delta V_{J0} \\ \Delta V_{J1} \\ \Delta V_{J2} \\ \Delta V_{J3} \\ \Delta V_{J4} \\ \Delta V_{J5} \end{bmatrix} = \begin{bmatrix} V_{J0L} - V_{J0R} \\ V_{J1L} - V_{J1R} \\ V_{J2L} - V_{J2R} \\ V_{J3L} - V_{J3R} \\ V_{J4L} - V_{J4R} \\ V_{J5L} - V_{J5R} \end{bmatrix}$$

Then the minimum amplitude value (modular) $\Delta V$min of the plurality of subtraction voltage phasors $\Delta V_J$ is determined using the equation: $\Delta V\text{min} = \min\{|\Delta V_{Jk}|, k=0, 1, 2, 3, 4, 5\}$.

The minimum amplitude value $\Delta V$min is subsequently compared with a predefined voltage threshold Vthres1 to determine whether $\Delta V$min is less than Vthres1. In FIG. 4, Vthres1 is exemplarily set at 0.02 times of the rated voltage of the power transmission scheme so that, for example, if the rated voltage is 110 V, then Vthres1 is 2.2 V.

If the minimum amplitude value $\Delta V$min is less than the predefined voltage threshold Vthres1, it indicates that the fault is either on the junction corresponding to the minimum amplitude value $\Delta V$min or in the further power transmission section connected to this junction. For example, if $|\Delta V_{J3}| = \Delta V$min, it indicates that the fault is either on the junction $J_3$ or in the further power transmission section interconnecting the junction $J_3$ and the terminal $T_4$.

Subsequently the location of the fault is more accurately determined by using the discriminative criterion of $|V_{JkL} - V_{Jk\_Tn}| > V$thres2, where $\Delta V$min$=V_{JkL}$. Therefore, for example, if $|\Delta V_{J3}| = \Delta V$min, the discriminative criterion is $|V_{J3L} - V_{J3\_T4}| > V$thres2. In FIG. 4, Vthres1 is exemplarily set at 0.05 times of the rated voltage of the power transmission scheme so that, for example, if the rated voltage is 110 V, then Vthres1 is 5.5 V.

If $|V_{JkL} - V_{Jk\_Tn}| > V$thres2, then the fault is located in the further power transmission section interconnecting the kth junction and the nth terminal. If $|V_{JkL} - V_{Jk\_Tn}| \leq V$thres2, then the fault is located on the kth junction. If there are multiple terminals connected to the junction in question, the discriminative criterion is applied to each terminal in turn.

If the minimum amplitude value $\Delta V$min is more than the predefined voltage threshold Vthres1, it indicates that the fault is in the power transmission section interconnecting the kth junction and the k+1th junction. For example, if $|\Delta V_{J3}| \Delta V$min, it indicates that the fault is in the power transmission sections interconnecting the junctions $J_0$, $J_1$, $J_2$, $J_3$, $J_4$, $J_5$.

Subsequently the location of the fault is more accurately determined by comparing the voltage phasor of a given junction with the voltage phasor of a neighbouring junction to identify the power transmission section corresponding to the location of the fault. Different criterion may be applied to determine the power transmission section in which the fault is located.

In a first exemplary criterion, the power transmission section in which the fault is located is determined by comparing the phases of the subtraction voltage phasor $\Delta V_{Jk}$ of a given junction and the subtraction voltage phasor $\Delta V_{Jk+1}$ of a neighbouring junction to check whether the comparison meets the following criterion:

$$90^0 < \arg\frac{\Delta V_{Jk}}{\Delta V_{Jk+1}} < 270^0$$

If the criterion is met, then the fault is located in the power transmission section interconnecting junctions $J_k$ and $J_{k+1}$.

In a second exemplary criterion, the power transmission section in which the fault is located is determined by comparing the amplitudes of the subtraction voltage phasor $\Delta V_{Jk}$ of a given junction and the subtraction voltage phasor $\Delta V_{Jk+1}$ of a neighbouring junction to check whether an amplitude comparison meets the following criterion:

$$\text{imag}\left(\frac{\Delta V_{Jk} \text{conj}(\Delta V_{Jk+1})}{|\Delta V_{Jk}||\Delta V_{Jk+1}|}\right) < \varepsilon_1$$

where $\varepsilon_1$ is the threshold with per-unit value. For example, $\varepsilon_1 = -0.01$.

If the criterion is met, then the fault is located in the power transmission section interconnecting junctions $J_k$ and $J_{k+1}$.

In a third exemplary criterion, the power transmission section in which the fault is located is determined by comparing the subtraction voltage phasor $\Delta V_{Jk}$ of a given junction and the subtraction voltage phasor $\Delta V_{Jk+1}$ of a neighbouring junction to check whether the comparison meets the following criterion.

$$|\Delta V_{Jk} + \Delta V_{Jk+1}| < |\Delta V_{Jk} - \Delta V_{Jk+1}|$$

If the criterion is met, then the fault is located in the power transmission section interconnecting junctions $J_k$ and $J_{k+1}$.

If a given power transmission section is identified as the location of the fault, Block C then selects the appropriate voltage and current phasors from $V_{JL}$, $V_{JR}$, $I_{JL}$ and $I_{JR}$ and forms a two-ended system equivalent of the power transmission section identified as the location of the fault with voltages and currents $V_M$, $V_N$, $I_M$, $I_N$.

If the relevant power transmission section is connected between junctions $J_k$ and $J_{k+1}$, the voltage and current phasors $V_{JkL}$, $I_{Jk\_k+1L}$, $V_{Jk+1R}$, $I_{Jk+1,kR}$ are selected to form the two-ended system equivalent such that: $V_M = V_{JkL}$; $I_M = I_{Jk\_k+1L}$; $V_N = V_{Jk+1R}$; and $I_N = I_{Jk+1\_kR}$. That is, junction $J_k$ is the equivalent end M of the two-ended system equivalent, and junction $J_{k+1}$ is the equivalent N of the two-ended system equivalent.

If the relevant power transmission section is a further power transmission section interconnecting a junction $J_k$ and a terminal Tn, Block C then selects the voltage and current phasors at the terminal Tn, the voltage phasor $V_{JkL}$, $V_{JkR}$ at the junction to which the terminal Tn is connected, and the negative summation of the corresponding current phasors of the first and second sets of current phasors $-(I_{Jk,\ k+1L} + I_{Jk,k-1R})$, such that: $V_M = V_{Tn}$; $I_M = I_{Tn}$; $V_N = V_{JkL}$; $I_N = -(I_{Jk,\ k+1L} + I_{Jk\_k-1R})$. That is, terminal Tn is the equivalent end M of the two-ended system equivalent, and junction $J_k$ is the equivalent end N of the two-ended system equivalent.

Based on the two-ended system equivalent the distance of the fault along the power transmission section is determined on the basis of the voltage and currents $V_M$, $V_N$, $I_M$, $I_N$ of the two-ended system equivalent. In the apparatus of FIG. 2, Block C feeds the voltage and currents $V_M$, $V_N$, $I_M$, $I_N$ of the two-ended system equivalent to Block D, which determines the fault distance using the following equation:

$$V_M \cos h(\gamma x) - Z_C I_M \sin h(\gamma x) = V_N \cos h(\gamma(l-x)) - Z_C I_N \sin h(\gamma(l-x))$$

where x is the distance to the end M of the two-system equivalent;

$\gamma = \sqrt{zy}$;
$Z_C = \sqrt{z/y}$;

z is the impedance per length of corresponding section, which is settable by customer;

y is the admittance per length of corresponding section, which is settable by customer;

l is the line length of corresponding section.

The above equation can be simplified as:

$$V_M - zxI_M = V_N - z(l-x)I_N$$

In the foregoing manner the method of the invention permits the determination of the location of a fault in a power transmission scheme.

It will be appreciated that the topology of the power transmission scheme in the embodiment of FIG. 1 is merely chosen to help illustrate the working of the invention, and that the invention is applicable to power transmission schemes based on different topologies. Such power transmission schemes may include, but are not limited to, a different number of power transmissions sections, a different number of junction, a different overall number of terminals, and a different number of terminals connected to each junction.

It is evident from the foregoing description of the method of locating a fault in the power transmission scheme of FIG. 1 that the method of the invention is readily scalable to accommodate different topologies of the power transmission scheme.

It will be also appreciated that the power transmission scheme of FIG. 1 may form the whole of a power transmission network or part of a more complex power transmission network.

It will be further appreciated that the values for the parameters described herein are merely chosen to help illustrate the working of the invention, and that these values may vary depending on the application of the power transmission scheme.

What we claim is:

1. A method of locating a fault in a power transmission scheme, the power transmission scheme including a plurality of power transmission sections and a plurality of connection points ($J_0$-$J_5$), the plurality of connection points including a first end connection point ($J_0$), a second end connection point ($J_5$) and at least one intermediate connection point ($J_1$-$J_4$) connected between the first and second end connection points ($J_0$, $J_5$), each of the plurality of power transmission sections arranged to interconnect a respective two of the plurality of connection points ($J_0$-$J_5$) such that the plurality of power transmission sections are connected successively between the first and second end connection points ($J_0$, $J_5$) and such that the or each intermediate connection point interconnects ($J_1$-$J_4$), or a respective neighbouring pair of the power transmission sections, the method comprising the steps of:

(i.) measuring first and second end voltage phasors at the first and second end connection points ($J_0$, $J_5$) respectively;

(ii.) obtaining a first set of voltage phasors, wherein the first set of voltage phasors includes the measured first end voltage phasor and further includes respective voltage phasors at each of the second and intermediate connection points that are determined based on the measured first end voltage phasor;

(iii.) obtaining a second set of voltage phasors, wherein the second set of voltage phasors includes the measured second end voltage phasor and further includes respective voltage phasors at each of the first and intermediate connection points that are determined based on the measured second end voltage phasor;

(iv.) comparing the first and second sets of voltage phasors to identify the power transmission section or connection point corresponding to the location of the fault, wherein each voltage phasor of the first set of voltage phasors is compared to the respective voltage phasor of the second set of voltage phasors that corresponds to the same connection point, wherein the comparing the first and second sets of voltage phasors further comprises:

obtaining a subtraction voltage phasor of each connection point, wherein the subtraction voltage phasor of each connection point is equal to the difference between the corresponding voltage phasors of the first and second sets of voltage phasors;

determining the minimum amplitude value of the plurality of subtraction voltage phasors; and comparing the minimum amplitude value with a predefined criterion threshold to identify the power transmission section or connection point corresponding to the location of the fault.

2. A method according to claim 1, further including the steps of:

measuring first and second end current phasors at the first and second end connection points ($J_0$, $J_5$) respectively;

obtaining the first set of voltage phasors, wherein the first set of voltage phasors includes the measured first end voltage phasor and further includes respective voltage phasors at each of the second and intermediate connection points that are determined based on the measured first end voltage and current phasors;

obtaining the second set of voltage phasors, wherein the second set of voltage phasors includes the measured second end voltage phasor and further includes respective voltage phasors at each of the first and intermediate connection points that are determined based on the measured second end voltage and current phasors.

3. A method according to claim 1, wherein the power transmission section connected to the first connection point ($J_0$) is a first power transmission section, the power transmission section connected to the second connection point ($J_5$) is a second power transmission section, the or each other power transmission section connected between the or the respective neighbouring pair of intermediate connection points ($J_1$, $J_4$) is an intermediate power transmission section, the method further including the steps of:

measuring first and second end current phasors at the first and second end connection points ($J_0$, $J_5$) respectively;

obtaining a first set of current phasors, wherein the first set of current phasors includes respective current phasors in the first, second and intermediate power transmission sections that are determined based on the measured first end voltage and current phasors;

obtaining a second set of current phasors, wherein the second set of current phasors includes respective current phasors in the first, second and intermediate power transmission sections that are determined based on the measured second end voltage and current phasors.

4. A method according to claim 3, wherein the respective voltage phasors at the second and intermediate connection points of the first set of voltage phasors are determined based on the measured first end voltage phasor and the first set of current phasors, and the respective voltage phasors at the first ($J_0$) and intermediate connection points ($J_1$-$J_4$) of the second set of voltage phasors are determined based on the measured second end voltage phasor and the second set of current phasors.

5. A method according to claim 1, wherein the power transmission scheme further includes a further power transmission section connecting the intermediate connection point to a further connection point or a plurality of further power transmission sections each connecting a respective one of the intermediate connection points to a respective one of a plurality of further connection points, the method further including the steps of:
measuring a or a respective voltage phasor at the or each further connection point;
measuring a or a respective current phasor at the or each further connection point;
determining a or a respective further current phasor flowing into the corresponding intermediate connection point and in the or each further power transmission section based on the measured voltage and current phasors of the corresponding further connection point.

6. A method according to claim 5, wherein the respective current phasors in the first, second and intermediate power transmission sections of the first set of current phasors are determined based on the measured first end voltage and current phasors and the or each further current phasor, and the respective current phasors in the first, second and intermediate power transmission sections of the second set of current phasors are determined based on the measured second end voltage and current phasors and the or each further current phasor.

7. A method according to claim 1, wherein the power transmission scheme further includes a further power transmission section connecting the intermediate connection point to a further connection point or a plurality of further power transmission sections each connecting a respective one of the intermediate connection points to a respective one of a plurality of further connection points, the method further including the steps of:
measuring a or a respective voltage phasor at the or each further connection point;
measuring a or a respective current phasor at the or each further connection point;
determining a or a respective further voltage phasor at the or each intermediate connection point based on the measured voltage and current phasors of the corresponding further connection point.

8. A method according to claim 1, wherein the step of comparing the first and second sets of voltage phasors includes:
if the minimum amplitude value is less than the predefined criterion threshold, comparing the voltage phasor and further voltage phasor of the intermediate connection point to determine whether the location of the fault is on the intermediate connection point or in the further power transmission section corresponding to the minimum amplitude value.

9. A method according to claim 1, wherein the step of comparing the first and second sets of voltage phasors further includes:
if the minimum amplitude value is more than the predefined criterion threshold, comparing the voltage phasors of the connection point corresponding to the minimum amplitude value with the voltage phasors of a neighbouring connection point to identify the power transmission section corresponding to the location of the fault.

10. A method according to claim 9, wherein the step of comparing the first and second sets of voltage phasors further includes:
if the minimum amplitude value is more than the predefined criterion threshold, comparing the phase or amplitude of the subtraction voltage phasor of the connection point corresponding to the minimum amplitude value with the phase or amplitude of the subtraction voltage phasor of a neighbouring connection point to identify the power transmission section corresponding to the location of the fault.

11. A method according to claim 1, further including the step of: if a given power transmission section is identified as the location of the fault, using the corresponding voltages and currents to form a two-ended system equivalent of the power transmission section identified as the location of the fault.

12. A method according to claim 11, further including the step of determining the distance of the fault along the power transmission section on the basis of the voltage and currents of the two-ended system equivalent.

13. An apparatus for locating a fault in a power transmission scheme, the power transmission scheme including a plurality of power transmission sections and a plurality of connection points ($J_0$-$J_5$), the plurality of connection points including a first end connection point ($J_0$), a second end connection point ($J_5$) and at least one intermediate connection point ($J_1$-$J_4$) connected between the first and second end connection points ($J_0$, $J_5$), each of the plurality of power transmission sections arranged to interconnect a respective two of the plurality of connection points ($J_0$-$J_5$) such that the plurality of power transmission sections are connected successively between the first and second end connection points ($J_0$, $J_5$) and such that the or each intermediate connection point ($J_0$-$J_5$) interconnects a or a respective neighbouring pair of the power transmission sections, the apparatus configured to:
(i) measure first and second end voltage phasors at the first and second end connection points ($J_0$, $J_5$) respectively;
(ii) obtain a first set of voltage phasors, wherein the first set of voltage phasors includes the measured first end voltage phasor and further includes respective voltage phasors at each of the second and intermediate connection points) that are determined based on the measured first end voltage phasor;
(iii) obtain a second set of voltage phasors, wherein the second set of voltage phasors includes the measured second end voltage phasor and further includes respective voltage phasors at each of the first and intermediate connection points that are determined based on the measured second end voltage phasor; and
(iv.) compare the first and second sets of voltage phasors to identify the power transmission section or connection point corresponding to the location of the fault, wherein each voltage phasor of the first set of voltage phasors is compared to the respective voltage phasor of the second set of voltage phasors that corresponds to the same connection point, wherein to compare the first and second sets of voltage phasors further comprises:
obtain a subtraction voltage phasor of each connection point, wherein the subtraction voltage phasor of each connection point is equal to the difference between the corresponding voltage phasors of the first and second sets of voltage phasors;

determine the minimum amplitude value of the plurality of subtraction voltage phasors; and compare the minimum amplitude value with a predefined criterion threshold to identify the power transmission section or connection point corresponding to the location of the fault.

14. A power transmission scheme including a plurality of power transmission sections and a plurality of connection points ($J_0$-$J_5$), the plurality of connection points including a first end connection point ($J_0$), a second end connection point ($J_5$) and at least one intermediate connection point ($J_1$-$J_4$) connected between the first and second end connection points ($J_0$, $J_5$), each of the plurality of power transmission sections arranged to interconnect a respective two of the plurality of connection points ($J_0$-$J_5$) such that the plurality of power transmission sections are connected successively between the first and second end connection points ($J_0$, $J_5$) and such that the or each intermediate connection point ($J_1$-$J_4$) interconnects a or a respective neighbouring pair of the power transmission sections, wherein the power transmission scheme further includes the apparatus of claim 13.

* * * * *